(12) United States Patent
Lindsay et al.

(10) Patent No.: US 7,580,279 B2
(45) Date of Patent: Aug. 25, 2009

(54) FLASH MEMORY CELLS WITH REDUCED DISTANCES BETWEEN CELL ELEMENTS

(75) Inventors: Roger W. Lindsay, Boise, ID (US); Frances May, Boise, ID (US); Robert Veltrop, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 11/450,760

(22) Filed: Jun. 9, 2006

(65) Prior Publication Data

US 2006/0226471 A1 Oct. 12, 2006

Related U.S. Application Data

(62) Division of application No. 10/881,042, filed on Jun. 30, 2004, now Pat. No. 7,208,407.

(51) Int. Cl.
*G11C 16/04* (2006.01)

(52) U.S. Cl. .............. 365/185.01; 365/185.05; 365/185.06; 365/185.1; 365/185.26; 365/185.27; 438/694; 438/713; 438/780; 257/314; 257/315; 257/437

(58) Field of Classification Search ............ 365/185.01, 365/185.05, 185.06, 185.1, 185.26, 185.27, 365/185.28; 257/314, 315, 437; 438/694, 438/713, 780
See application file for complete search history.

(56) References Cited

U.S. PATENT DOCUMENTS

| | | | | |
|---|---|---|---|---|
| 3,945,030 A | | 3/1976 | Seales | |
| 5,337,274 A | * | 8/1994 | Ohji | 365/185.01 |
| 5,568,418 A | * | 10/1996 | Crisenza et al. | 365/185.01 |
| 5,594,684 A | * | 1/1997 | Hsue | 365/185.01 |
| 6,027,959 A | * | 2/2000 | En et al. | 438/142 |
| 6,121,123 A | * | 9/2000 | Lyons et al. | 438/585 |
| 6,153,469 A | | 11/2000 | Yun et al. | |
| 6,166,407 A | * | 12/2000 | Ohta | 257/298 |
| 6,407,002 B1 | * | 6/2002 | Lin et al. | 438/713 |
| 6,423,474 B1 | * | 7/2002 | Holscher | 430/312 |
| 6,432,765 B1 | | 8/2002 | Keller et al. | |
| 6,514,868 B1 | * | 2/2003 | Hui et al. | 438/713 |
| 6,528,418 B1 | | 3/2003 | Kim et al. | |
| 6,545,308 B2 | | 4/2003 | Keller et al. | |
| 6,579,763 B1 | * | 6/2003 | Lindsay | 438/258 |
| 6,706,592 B2 | | 3/2004 | Chern et al. | |
| 6,849,531 B1 | * | 2/2005 | Lin et al. | 438/585 |
| 6,878,622 B1 | * | 4/2005 | Yang et al. | 438/640 |
| 6,954,381 B2 | * | 10/2005 | Guterman et al. | 365/185.28 |
| 7,208,407 B2 | * | 4/2007 | Lindsay et al. | 438/637 |
| 2004/0016956 A1 | * | 1/2004 | Choi et al. | 257/315 |
| 2004/0130947 A1 | * | 7/2004 | Fan et al. | 365/185.05 |
| 2006/0019114 A1 | * | 1/2006 | Thies et al. | 428/522 |
| 2007/0045230 A1 | * | 3/2007 | Keller et al. | 216/81 |
| 2007/0077780 A1 | * | 4/2007 | Wang et al. | 438/780 |

* cited by examiner

*Primary Examiner*—Anh Phung
*Assistant Examiner*—Eric Wendler
(74) *Attorney, Agent, or Firm*—Leffert Jay & Polglaze, P.A.

(57) ABSTRACT

An anti-reflective coating (ARC) is formed over the various layers involved in a cell fabrication process. The ARC is selectively etched such that the edges of the etched areas of the ARC slope downward at an angle determined by the thickness of the ARC. The etching process could include $CF_4$ chemistry. The inner edges of the sloped ARC areas reduce the original photo-defined space since the underlying layers are now defined by the sloped edges.

19 Claims, 4 Drawing Sheets

FLASH MEMORY CELLS WITH REDUCED DISTANCES BETWEEN CELL ELEMENTS

RELATED APPLICATION

This Application is a Divisional of U.S. application Ser. No. 10/881,042, titled "FLASH MEMORY CELLS WITH REDUCED DISTANCES BETWEEN CELL ELEMENTS," filed Jun. 30, 2004 and issued as U.S. Pat. No. 7,208,407 which is commonly assigned and incorporated herein by reference.

TECHNICAL FIELD OF THE INVENTION

The present invention relates generally to memory devices and in particular the present invention relates to flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

A typical flash memory device comprises a memory array that includes a large number of memory cells arranged in row and column fashion. Each of the memory cells includes a floating gate field-effect transistor capable of holding a charge. The cells are typically grouped into blocks. Each of the cells within a block can be electrically programmed in a random basis by charging the floating gate. The charge can be removed from the floating gate by a block erase operation. The data in a cell is determined by the presence or absence of the charge in the floating gate.

As the performance of computer systems in which the flash memories reside increase, the flash memories' performance and density should also increase. Some methods typically used to increase the density of a memory device include decreasing the size of the memory cells or reducing the space between the cells.

A problem with using either of these methods is the limitations of the photo etching process. There is a limitation on the size of spaces that can be printed between components of a cell.

For the reasons stated above, and for other reasons stated below which will become apparent to those skilled in the art upon reading and understanding the present specification, there is a need in the art for a way to reduce the distance between elements of flash memory cells.

DETAILED DESCRIPTION

Figure 1:
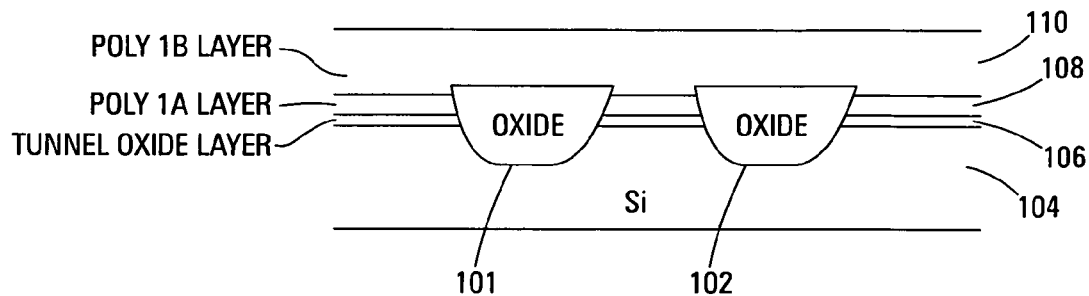
FIG. 1 shows a cross-sectional view of a step in one embodiment of the method for generating small spaces between floating gates of flash memory cells.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a cross-sectional view of an initial step of one embodiment of the method for generating a small space between floating gates of flash memory cells. A standard shallow trench isolation (STI) process is used to generate the cross-sectional embodiment illustrated.

The cross-sectional view is comprised of a silicon substrate 104 over which a tunnel oxide layer 106 is formed. A first polycrystalline silicon layer 108 (poly 1A) is formed on top of the tunnel oxide layer 106. Oxide dielectric areas 101 and 102 are formed in these layers 104, 106, and 108. A polycrystalline silicon 1B layer 110 is formed on top of the poly 1A layer 108. The poly 1B layer 110 is utilized as the floating gate of the various cells in the flash memory array.

In the embodiment of FIG. 1, the poly 1A layer 108 has a different composition from the poly 1B layer 110 since the poly 1B layer is the floating gate layer. However, this difference is not relevant to proper operation of the present invention. Alternate embodiments may use the same silicon material for the poly 1A 108 and 1B 110 layers.

The poly 1A layer 108 is self-aligned to the STI 101 and 102 and enables the tunnel oxide layer 106 to be more uniform across the entire width of the active area. In the method of the present invention where the polysilicon material is deposited after the STI processing, it may be difficult to avoid either tunnel oxide thinning or thickening at the active area edges. This non-uniformity in the tunnel oxide thickness can have a large impact on program and erase operation speeds of NAND architecture flash cells. The poly 1B layer 110 increases the area of each flash cell.

Figure 2:
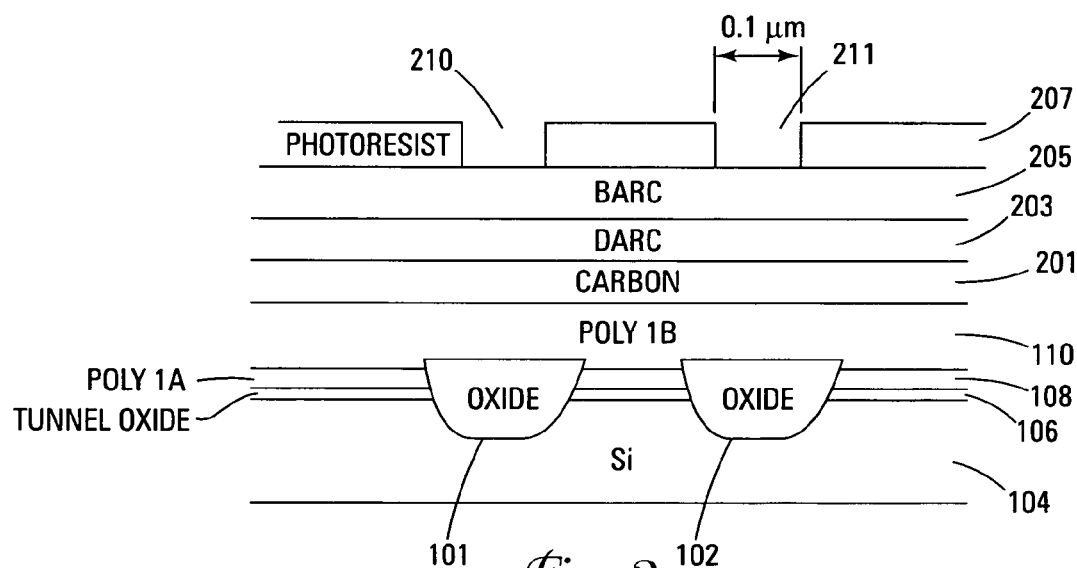
FIG. 2 shows a cross-sectional view of another step of the embodiment of FIG. 1 for generating small spaces between floating gates of flash memory cells.

FIG. 2 illustrates a cross-sectional view of the continued processing of the embodiment of FIG. 1. This embodiment initially deposits a carbon layer 201 on top of the poly 1B layer 110.

The carbon layer 201 acts as a hard mask since photoresist may not work well in such an embodiment. The carbon layer 201, in one embodiment, uses a chemical vapor deposition (CVD) process in which the thickness of the layer 201 is based on the need for etch resistance (i.e., the thicker the layer, the more resistance).

The embodiments of the present invention are not limited to carbon for this layer 201. The present invention encompasses any hard mask material. Such materials include oxides or nitrides.

A dielectric anti-reflective coating (DARC) layer 203 is then deposited over the carbon or other hard mask layer 201 using a CVD process. As is well known in the art, the DARC layer 203 increases the effectiveness of the photoresist layer 207 by absorbing light and preventing the lower silicon layers from reflecting the light back to the photoresist layer 207. In one embodiment, the DARC layer 203 is a 258 Å film. Alternate embodiments use other thicknesses.

The chemical composition of the DARC layer 203 is typically a silicon rich oxide. The present invention, however, is not limited to any one chemical composition for the DARC layer 203.

A second anti-reflective coating (ARC), such as a bottom anti-reflective coating (BARC) layer 205, is then deposited on the DARC layer 203. The BARC layer 205, in one embodiment, is a spin-on organic film that is a composition of methoxy, propanol acetate, and butanol acetate. Alternate embodiments may use other compositions.

As illustrated later with reference to FIG. 3, the properties of the BARC layer 205 are such that, when etched with certain processes, the etched area slopes inward instead of straight down. This has the effect of shrinking the original opening in the photoresist layer 207. The thickness of the BARC layer 205 determines how narrow the gap becomes (i.e., amount of shrinkage) between the floating gates. A thicker BARC layer 205 provides a more narrow space. Similarly, shorter etch times result in a more narrow space.

In one embodiment, the BARC layer 205 is a 320 Å film that shrinks a 0.1 μm opening to a 0.04 μm opening. Alternate embodiments use other film thicknesses depending on the amount of space shrinkage desired.

The photo resist layer 207 is deposited on top of the BARC layer 205. As is well known in the art, the resist layer 207 is patterned with openings 210 and 211 in such a way that those openings are etched while the remaining areas resist etching. In the illustrated embodiment of FIG. 2, the openings above the oxide filled trenches 101 and 102 are 0.1 μm in width. This width is for purposes of illustration only since the opening widths will vary with the embodiment.

Figure 3:
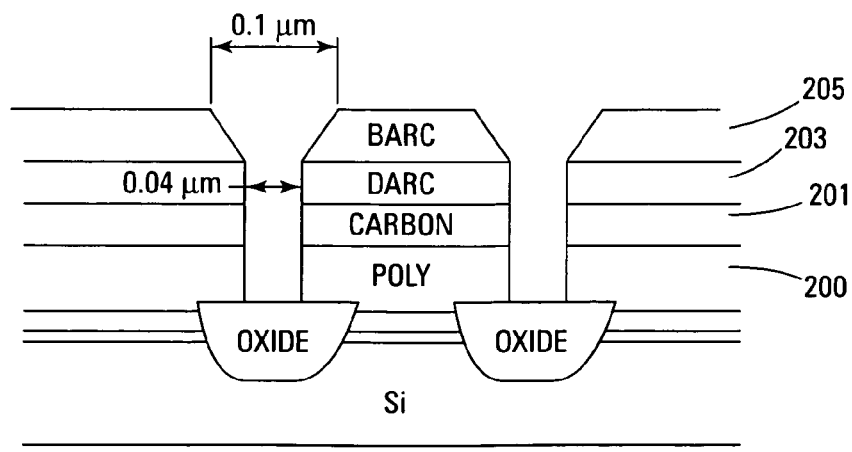
FIG. 3 shows a cross-sectional view in accordance with the embodiment of FIG. 2 in which the layers have been etched.

FIG. 3 illustrates the embodiment of FIG. 2 after an etch operation. In this embodiment, a dry etch operation has removed portions of the BARC layer 205. The initial 0.1 μm opening that was in the etch resist layer of FIG. 2 has been reduced to a 0.04 μm opening at the top of the DARC layer 203.

The dry etch process is an etch process that is carried out in the gas-phase. The process can be either chemical (e.g., plasma etching), purely physical (e.g., ion milling) or a combination (e.g., reactive ion etching).

In one embodiment, the dry etch process is comprised of using $CF_4$ chemistry to etch through the BARC and DARC layers 205 and 203 in order to define the carbon layer 201. This dry etching process produces the slopes edges of the BARC layer 205 and goes straight through the DARC layer 203. Alternate embodiments may use other etching chemistry than $CF_4$ that provides a weak enough etch process to slope the edges of the defined areas of the BARC layer 205.

As discussed previously, the size of the space between floating gates (i.e., slope of the BARC layer edges) can be controlled by the thickness of the BARC layer 205. The size of the space can also be controlled by the addition of a BARC etch step using $SO_2$ and Ar to the dry etch process. The DARC step etch time may also be used to control the size of the space.

After the etching of the BARC and DARC layers 205 and 203, the carbon layer 201 can then be etched. In one embodiment, this is done with $SO_2$, $O_2$, and Ar. Alternate embodiments may use other gases especially if alternate materials are used for the hard mask in place of the carbon material.

The next step comprises a dry etch process through the poly layer 200 that is aligned with the hard mask layer 201. In the embodiment of FIG. 3 this is the carbon layer.

Figure 4:
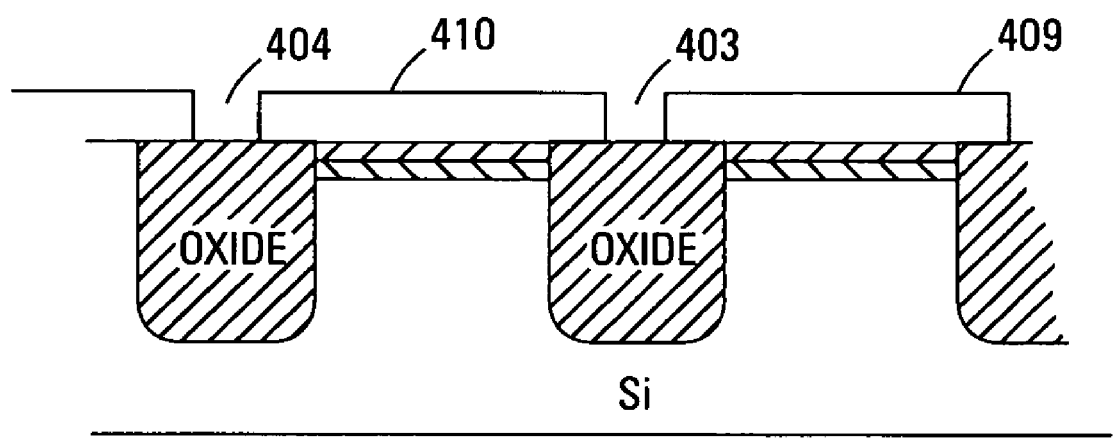
FIG. 4 shows a cross-sectional view in accordance with the embodiment of FIG. 3 after all the masking layers have been removed.

FIG. 4 illustrates a cross-sectional view of the non-volatile memory cells of the present invention after the etching processes described previously. Standard processing for wordlines and backend processing are subsequently performed but are not shown. These processes are well known in the art and are not discussed further.

The embodiment of FIG. 4 shows the floating gates 409 and 410 extending into the page along the z-axis. The substantially smaller spaces 403 and 404 that result from the methods of the present invention are shown between the floating gates 409 and 410.

Figure 5:
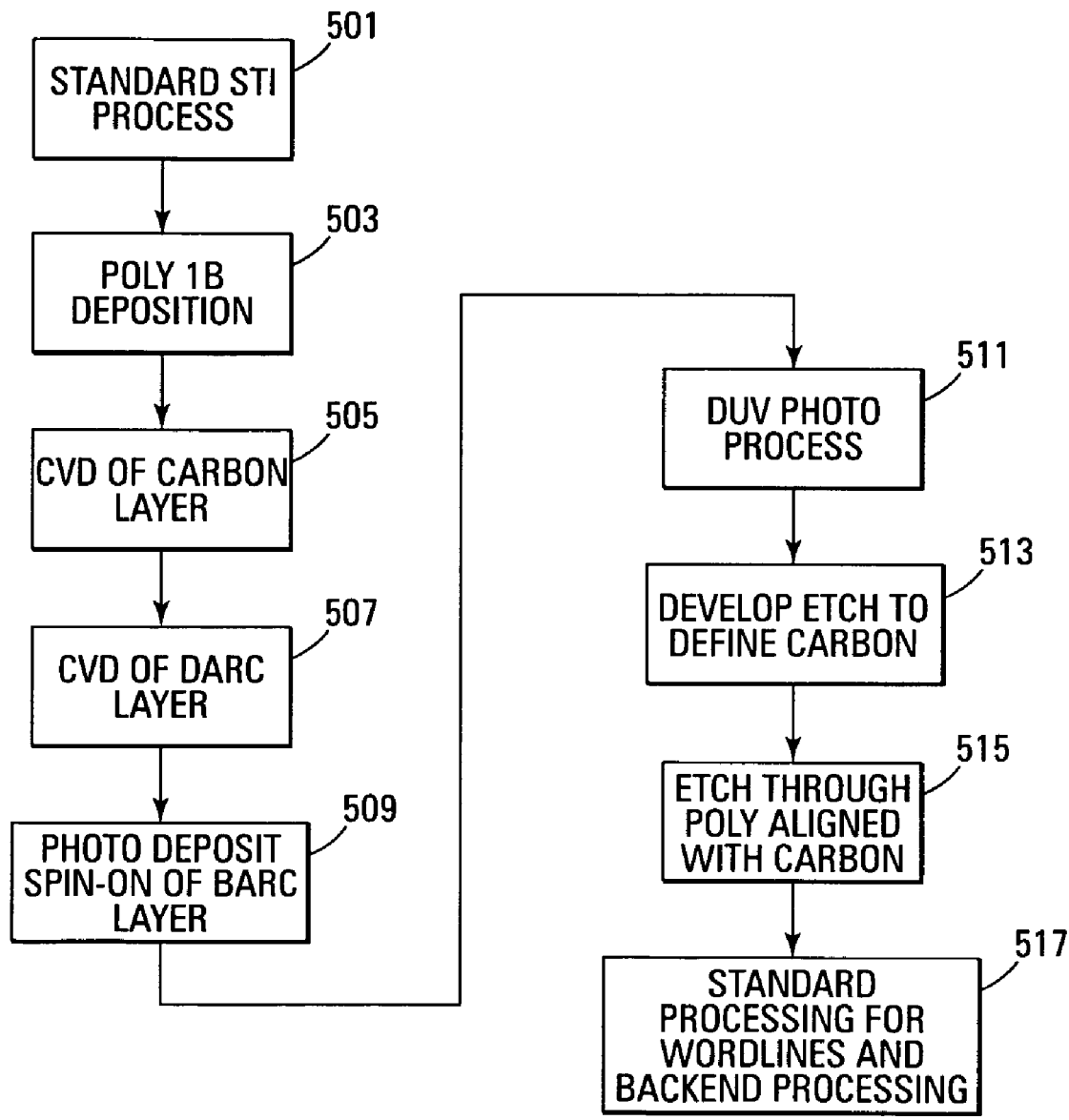
FIG. 5 shows a flowchart of one embodiment of the method of the present invention for generating small spaces between floating gates of flash memory cells.

FIG. 5 illustrates a flowchart of one embodiment of a method for generating reduced spaces between floating gates of a non-volatile memory device. A standard STI process 501 is first used to form the oxide filled trenches in the silicon substrate. This includes depositing the tunnel oxide layer and a polycrystalline silicon 1A layer on the surface of the substrate.

A polycrystalline silicon 1B layer is then deposited 503 over the poly 1A layer. In one embodiment, the poly 1B layer has a different doping than the poly 1A layer. A film of chemical vapor deposition (CVD) carbon is deposited over the poly 1B layer 505. As is well known in the art, the CVD process deposits the carbon as a result of a chemical reaction between gaseous reactants at elevated temperatures in the vicinity of the silicon substrate.

A film of CVD DARC is then deposited 507 on the carbon layer. A photo deposit spin-on of a BARC layer is performed 509. As described previously, the thickness of this layer depends on the amount of space shrinkage desired from the original photoresist mask opening.

A deep ultra-violet (DUV) photo process is then used to define the BARC layer 511. This step includes depositing a photoresist layer in a predetermined pattern for defining the BARC layer in a desired manner. A dry develop etch process is then used to define the carbon layer 513. In one embodiment, this process includes using $CF_4$ chemistry etch through the BARC and DARC layers. This results in inwardly sloped edges of the BARC layer and straight through the DARC layer. The carbon or other hard mask layer is then etched with $SO_2$, $O_2$, and Ar or other appropriate chemistry required for etching the hard mask.

The poly that is aligned with the etched hard mask layer is then etched 515. This can be accomplished with any dry etch process that is well known in the art.

The wordlines and other components of the non-volatile memory cell are then defined with standard processing. The standard processing is well known in the art and not discussed further.

The method illustrated in FIG. 5 is for purposes of illustration and does not limit the embodiments of the present invention to any certain order or quantity of fabrication steps. For example, the present invention is not limited to any one type of etching. Additionally, the embodiments of the present invention are not limited to only reducing the space between floating gates. These methods may be effective for reducing the photo-limited distances between any element of an integrated circuit during the fabrication process.

The above-described methods of the present invention for reducing the space between floating gates of a non-volatile memory cell are not limited to any one type of non-volatile memory architecture. The present invention encompasses NAND flash memory, NOR flash memory as well as other types of non-volatile memory.

Figure 6:
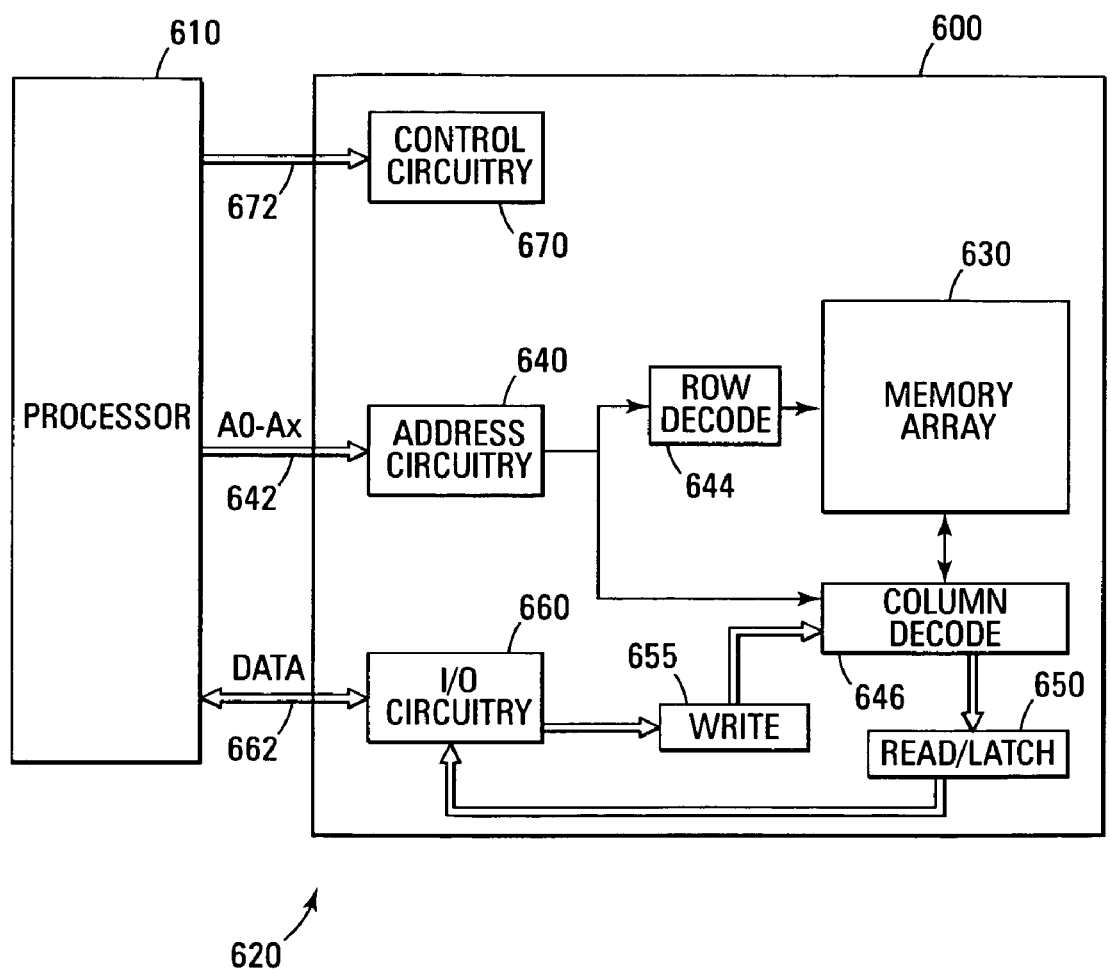
FIG. 6 shows a block diagram of an electronic system of the present invention.

FIG. 6 illustrates a functional block diagram of a memory device 600 that can incorporate the non-volatile memory cells formed by the methods of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

In one embodiment, the memory device includes an array of flash memory cells 630. The memory array 630 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture as well as other architectures.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write, and erase operations. The control circuitry 670 may be a state machine, a sequencer, or some other type of controller.

The flash memory device illustrated in FIG. 6 has been simplified to facilitate a basic understanding of the features of the memory. A more detailed understanding of internal circuitry and functions of flash memories are known to those skilled in the art.

CONCLUSION

In summary, the embodiments of the present invention provide a greatly reduced distance between floating gates of non-volatile memory cells. The reduced distance is substantially less than is possible with conventional photoresist etch processes.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-volatile memory device comprising:
a data bus;
an address bus; and
an array of memory cells coupled to the data and address buses, each cell comprising a floating gate that is separated from floating gates of adjacent cells by a space that was formed as part of a selective etch of a floating gate layer and a bottom anti-reflective coating formed on a dielectric anti-reflective coating with an etch process that produces edges on the etched areas that slope downward to an underlying layer, wherein both the bottom anti-reflective coating and the dielectric anti-reflective coating are subsequently removed after the space is formed.

2. The device of claim 1 wherein the array of memory cells is comprised of a NAND structure.

3. The device of claim 1 wherein the array of memory cells is comprised of a NOR structure.

4. The device of claim 1 wherein each space is formed over shallow trench isolation areas.

5. The device of claim 4 wherein the shallow trench isolation areas are comprised of an oxide.

6. The device of claim 4 wherein the shallow trench isolation areas are formed in a silicon substrate.

7. An electronic system comprising:
a processor that generates control signals; and
a non-volatile memory device, coupled to the processor and comprising:
a data bus;
an address bus; and
an array of memory cells coupled to the data and address buses, each cell comprising a floating gate that is separated from floating gates of adjacent cells by a space that was formed as part of a selective etch of a floating gate layer and a bottom anti-reflective coating formed on a dielectric anti-reflective coating by an etch process that produces edges on the etched areas that slope downward to an underlying layer, wherein both the bottom anti-reflective coating and the dielectric anti-reflective coating are subsequently removed after the space is formed.

8. The electronic system of claim 7 wherein the non-volatile memory is a NAND architecture flash memory.

9. The electronic system of claim 7 wherein the non-volatile memory is a NOR architecture flash memory.

10. The electronic system of claim 7 and further including a memory controller circuit for controlling operation of the memory device.

11. The electronic system of claim 7 wherein the non-volatile memory device operates in response to the control signals.

12. The electronic system of claim 7 wherein the non-volatile memory device is formed on a substrate comprising shallow trench isolation under each space.

13. A flash memory device comprising:

control circuitry for controlling operation of the device; and an array of memory cells coupled to the control circuitry, each cell comprising a floating gate that is separated from floating gates of adjacent cells by a space that was formed as part of a selective etch of a floating gate layer and a bottom anti-reflective coating formed on a dielectric anti-reflective coating with an etch process that produces edges on the etched areas that slope downward and inward to an underlying layer, wherein both the bottom anti-reflective coating and the dielectric anti-reflective coating are subsequently removed after the space is formed.

14. The device of claim 13 wherein the array is one of a NAND or a NOR architecture.

15. The device of claim 13 wherein the underlying layer is a polysilicon layer.

16. The device of claim 13 wherein each anti-reflective coating is comprised of an organic film that is a composition of methoxy, propanol acetate, and butanol acetate.

17. The device of claim 15 wherein the polysilicon layer is formed over a silicon substrate.

18. The device of claim 15 wherein the etch process forms the floating gates out of the polysilicon layer.

19. The device of claim 18 wherein the floating gates are formed between oxide isolation areas in response to the spaces.

* * * * *